(12) United States Patent
Gurovich et al.

(10) Patent No.: US 6,218,278 B1
(45) Date of Patent: Apr. 17, 2001

(54) METHOD OF FORMING A CONDUCTING STRUCTURE

(75) Inventors: Boris Aronovich Gurovich; Dmitry Iosifivich Dolgy; Evgeny Pavlovich Velikhov; Evgenia Anatolievna Kuleshova; Boris Aronovich Aronzon; Evgeny Zalmanovich Meilikhov; Evgeny Petrovich Ryazantsev; Vladimir Vasilievich Rylkov; Kirill Evgenievich Prikhodko; Alexandr Grigorievich Domantovsky; Yaroslav Igorevich Shtrombakh; Evgeny Dmitrievich Olshansky, all of Moscow (RU)

(73) Assignee: Obschestvo s ogranichennoi otvetstvennostju "Laboratoria Ionnykh Nanotekhnology", Moscow (RU)

( * ) Notice: Subject to any disclaimer, the term of this patent is extended or adjusted under 35 U.S.C. 154(b) by 0 days.

(21) Appl. No.: 09/316,532

(22) Filed: May 21, 1999

(30) Foreign Application Priority Data

May 22, 1998 (RU) .................................................. 98109498

(51) Int. Cl.⁷ .................................................. H01L 21/44
(52) U.S. Cl. .......................... 438/597; 438/712; 438/257
(58) Field of Search ..................................... 438/597, 257, 438/256, 712, 707, 710, 720, 727; 430/296

(56) References Cited

U.S. PATENT DOCUMENTS

| | | | |
|---|---|---|---|
| 4,938,996 | * 7/1990 | Ziv et al. | 427/53.1 |
| 5,060,595 | * 10/1991 | Ziv et al. | 118/722 |
| 5,106,779 | * 4/1992 | Yu | 437/174 |
| 5,325,265 | * 6/1994 | Turlik et al. | 361/712 |
| 5,459,098 | 10/1995 | Maya . | |
| 5,516,726 | * 5/1996 | Kim et al. | 437/789 |
| 5,559,057 | 9/1996 | Goldstein . | |
| 5,759,906 | * 6/1998 | Iou | 438/623 |
| 6,069,380 | * 5/2000 | Chou et al. | 257/315 |

* cited by examiner

Primary Examiner—Matthew Smith
Assistant Examiner—V. Yevikov
(74) Attorney, Agent, or Firm—Collard & Roe, P.C.

(57) ABSTRACT

The method of forming a conducting structure consists in applying to a substrate a 2 to 20 nm thick layer of a material transformable into conducting one under the effect of radiation, and irradiating the layer of the material with a modulated beam of charged particles, with the result that the material of the layer on each irradiated area thereof is transformed into a conducting component forming on the substrate a plurality of conducting structure elements, and a nonconducting component which is displaced into the substrate material.

21 Claims, 1 Drawing Sheet

METHOD OF FORMING A CONDUCTING STRUCTURE

The present invention relates to the fabrication technique of complicated conducting structure using charged particles.

FIELD OF THE INVENTION

The present invention can find application in microelectronics for lithographic formation of integrated microcircuits, memories, and optic elements having some components of the conducting structure falling within the nanometric range.

BACKGROUND OF THE INVENTION

Up till now the modern microelectronics has been developing by way of successively reducing the microcircuit elements from micron to submicron size range. But ever increasing urgent demands in developing nanometric-size elements leads to search for novel techniques of lithographic formation of a conducting structure that assure high resolution which herein implies a minimum size of the elements of the conducting structure under development, that determines a limiting permissible density of a conducting structure elements per unit length or unit area without a contact therebetween.

One prior-art method of forming a pattern using electron beam (WO 95/26042). The method consists in placing an electron beam focusing system in the reaction chamber, arranging on the electron beam axis the mask and the wafer under processing coated with the layer of a material (photoresist) transformable when exposed to the effect of radiation. Then the wafer is irradiated with an electron beam, with the result that the material of the wafer surface layer undergoes transformation.

However, the aforementioned known method makes use of a widely spread technique of applying a layer of photoresist to the wafer, which technique allows of applying said layer having a thickness on the order of hundreds of nanometers (200 to 500 nm) which makes it impossible to obtain the pattern elements of a conducting structure having linear dimensions on the order of unities of nanometers.

Moreover, according to the known method, the conducting structure elements are formed successively so that whenever necessity arises to provide high density of elements per unit area of the structure being formed, e.g., a microchip, it requires a long period of time running into hundreds and even thousands of hours.

One more heretofore-known method of forming a metal-substrate conducting structure is known (U.S. Pat. No. 5,459,098) to comprise the steps of applying a metal nitride layer to a dielectric substrate and irradiating the latter with a concentrated (focused) laser beam, whereby the metal nitride is decomposed into a solid metallic conducting component which remains on the substrate, and a gaseous nonconducting component which is removed in the course of further carrying out the method. The metal nitride decomposition temperature lies within the range of from 100 to 1000° C. The method is effected in a reaction chamber which is filled with an inert gas or wherein a required vacuum is established. A required pattern is formed from the conducting structure elements due to scanning the substrate surface with a laser beam according to a preset program, which affects adversely the production output of the method.

The method under consideration features but a low resolution because it is deemed impossible to obtain individual elements having linear dimensions on the order of unities and even tenths of nanometers. This is accounted for by the fact that to focus a laser spot to such a smallest size is a very difficult task. Besides, when a laser beam is incident on the layer of metal nitride the laser spot gets blurred due to heat conduction of metal, which results in increased linear dimensions of each individual element of the conducting structure. Therefore the method of photolithography is but of little use for forming conducting structure elements having linear dimensions in the nanometric range.

Moreover, as far as our knowledge goes, the known method in question fails to have found widespread industrial application because to provide long-length conducting structures, e.g., wire conductors in electronic circuits, a very prolonged period of time amounting to hundreds and thousands of hours is required.

Thus, every heretofore-known methods are featured by a multistage and labor-consuming production process; whenever a single-stage process is used it suffers from low production output which places limitation upon the range of practical application of said methods.

SUMMARY OF THE INVENTION

It is a primary object of the present invention to provide individual elements of a conducting structure which have linear dimensions on the order of unities of nanometers.

It is another object of the invention to provide a possibility for establishing a three-dimensional layer-type conducting structure enabling multilayer electronic circuits, e.g., integrated circuits for computer technology.

The foregoing object is accomplished due to the fact that in a method of forming a conducting structure, comprising applying to a substrate a layer of a material transformable into a conducting one when exposed to the effect of radiation and irradiating said layer of said material with a modulated radiation beam, according to the invention, the applied layer of said material is 2 to 20 nm thick and used as the radiation is a beam of charged particles, whereby the material of said layer is transformed, on the irradiated areas, into a conducting component which establishes in said layer a plurality of conducting structure elements, a nonconducting component displaced into the material of the substrate.

The proposed method enables one to form in the layer of said material a conducting structure element having the smallest possible size, this being due to irradiating a layer of a material transformable under the effect of irradiation with a beam of charged particles whose wavelength is less than the wavelength of an optical (in particular, laser) radiation. The fact that the thickness of the layer of said material ranges between 2 and 20 nm contributes to attaining the required resolution, that is, required spatial arrangement of the conducting structure elements with a preset density.

By and large, it is due to said features that the proposed method makes possible forming individual conducting structure elements having linear dimensions on the order of unities of nanometers.

It is beneficial that used as the material of said layer be a single-phase semiconductor or dielectric metalliferous material comprising at least atoms of a first kind and atoms of a second kind which differ in atomic number; used for establishing a charged beam are charged particles each having an energy transferred by said particle upon its interaction with the atoms of the material of said layer in the course of irradiation, which energy is lower than the threshold displacement energy of the first-kind atoms and is higher than the threshold displacement energy of the second-kind atoms;

the material of said layer undergoes transformation by displacing second-kind atoms on the irradiated areas of said layer into the substrate material and by transforming first-kind atoms on the irradiated areas of said layer into a plurality of the conducting structure elements.

It is reasonable that the energy transferred by a charged particle upon its interaction with said atoms of said material of said layer be found from the following relationship $$E_{max} = 4E_o \frac{M_1 \cdot M_2}{(M_1 + M_2)^2},$$

where
- $E_{max}$ is maximum energy transferred by said charged particle to the atoms of each kind;
- $E_o$ is the energy of said charged particle;
- $M_1$ is the mass of said charged particle;
- $M_2$ is the mass of said atom of each kind with which said charged particles collide.

The fact that used as the material applied to the substrate layer is a material having the aforedescribed properties and that the abovedescribed range of energies of charged particles is selected, provides for, in the course of irradiation, conditions for separating said material into a conducting and a nonconducting component of which the nonconducting component is displaced inwards the substrate material and thus does not virtually affect the substrate conducting properties, whereas the conducting component remains in the layer of the material, thus establishing a plurality of the conducting structure elements having linear dimensions on the order of unities of nanometers. Displacing the nonconducting component into the bulk of the substrate material is a characteristic feature of the proposed method over the heretofore-known methods, wherein the nonconducting component is discharged into the ambient medium.

It is advantageous that used as the first layer material be the material selected from the group consisting of metal hydrides, metal oxides, and metal nitrides.

It is preferable that used as the metal hydride be lanthanum hydride or ytterbium hydride; used as the metal oxide be uranium dioxide, and used as the metal nitride be gallium nitride.

The materials mentioned before are made use of rather rarely in the heretofore-known methods; however, it is such materials that are capable of displacing the nonconducting component into the substrate material upon separating said material into a conducting and nonconducting component.

It is preferable that used as the substrate material be the material selected from the group consisting of a dielectric material, a semiconductor material, and an electrically conducting material.

Thus, no specific requirements are imposed on as to conduction, which allows forming conducting structures on substrates of any required materials, thus extending the technological capabilities of the method.

It is reasonable that the layer of material applied to the substrate be irradiated with a modulated electron beam or ion beam.

This feature adds to the resolution capability of the method, since both electron and ion beams can be focused down to nanometric dimensions, in particular, to unities and tenth of nanometers.

It is expedient that used for establishing a three-dimensional conducting structure be said layer of material after a plurality of conducting structure elements have been therein established, as a substrate for forming a three-dimensional conducting structure; a plurality of ensuing layers of a material transformable into a conducting layer under the effect of radiation are applied in succession to each preceding layer after a plurality of conducting structure elements have been thereon established; each next layer applied to each preceding layer is 2 to 20 nm thick; each next layer is irradiated with a modulated beam of charged particles to transform the material of each next layer on its irradiated areas into a conducting component which establishes in each next layer a plurality of conducting structure elements, and a nonconducting components which is displaced into the material of the preceding layer.

Thus, a three-dimensional conducting structure is formed, wherein each of its layers has a thickness of the same order of magnitude as the linear dimensions of individual conducting structure elements, which adds much to the resolution capability of the proposed method and extends the field of application of the conducting structures thus manufactured. The resultant three-dimensional conducting structure can find application for producing wires connecting the elements of electronic circuits situated in different layers.

It is appropriate that used as the material of each next layer be a single-phase semiconductor or dielectric metal-liferous material comprising at least atoms of a first kind and atoms of a second kind which differ in atomic number; used for establishing a charged beam are charged particles each having an energy transferred by said particle upon its interaction with the atoms of the material of each next layer in the course of irradiation, which energy is lower than the threshold displacement energy of the first-kind atoms and is higher than the threshold displacement energy of the second-kind atoms; the material of said layer undergoes transformation by displacing second-kind atoms on the irradiated areas of said layer into the material of the preceding layer and by transforming first-kind atoms on the irradiated areas of each next layer into a plurality of the conducting structure elements.

The fact that used as the material that forms the second conducting structure layer and all subsequent layers thereof is a material with the aforementioned properties and that the abovedescribed range of energies of charged particles is selected, provides for, in the course of irradiation, conditions for separating said material into a conducting and a nonconducting component as has been described with reference to the first layer of the material. In this case the nonconducting component is dislodged inwards the material of a first (preceding) layer which serves as the substrate for a next layer, while the conducting properties of the preceding layer remain virtually invariable and the conducting component remains in the layer of the material to form a plurality of conducting structure elements having linear dimensions on the order of unities of nanometers.

It is desirable that the energy transferred by a charged particle upon its interaction with said atoms of said material of said layer be found from the following relationship $$E_{max} = 4E_o \frac{M_1 \cdot M_2}{(M_1 + M_2)^2},$$

where
- $E_{max}$ is maximum energy transferred by said charged particle to the atoms of each kind;
- $E_o$ is the energy of said charged particle;
- $M_1$ is the mass of said charged particle;
- $M_2$ is the mass of said atom of each kind with which said charged particles collide.

It is helpful that used as the material of each next layer be the material selected from the group consisting of metal hydrides, metal oxides, and metal nitrides.

It is preferable that used as a metal hydride be lanthanum hydride or ytterbium hydride; used as a metal oxide be uranium dioxide, and used as a metal nitride be gallium nitride.

The materials mentioned before are made use of rather rarely in the heretofore-known methods; however, it is such materials that are capable of displacing the nonconducting component into the substrate material upon separating said material into a conducting and nonconducting component.

It is expedient that each next layer be irradiated with a modulated beam of charged particles or of ions.

It is reasonable that an intermediate layer of a dielectric material be interposed between each preceding and each next layer of the material.

Said feature makes possible formation of multilayer ultra large-scale integrated circuits (ULSIC).

Further objects and advantages of the present invention will become apparent from a detailed description, exemplary embodiments thereof and the accompanying drawings.

DESCRIPTION OF THE PREFERRED EMBODIMENT

Figure 1:
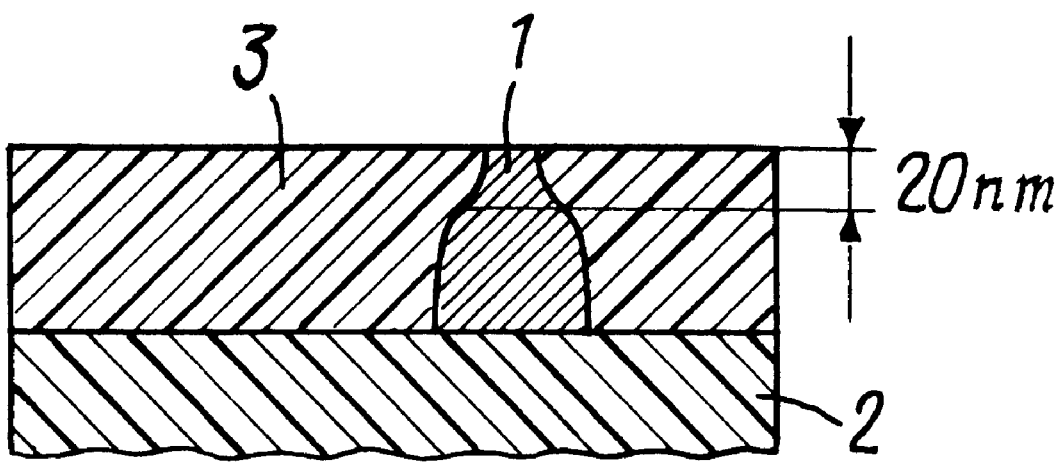
FIG. 1 is a longitudinal sectional view of an individual conducting structure.

The herein-proposed method of forming a conducting structure, according to the invention, consists of the following steps. A first layer of a material transformable into conductor layer under the effect of radiation is, e.g., spray-deposited on a substrate, said layer being 2 to 20 nm thick. A beam of charged particles, i.e., electrons or ions is established, which is modulated and directed onto the layer of material applied to the substrate. It is common knowledge to those skilled in the art that electron and ion beams can be focused to nanometric dimensions, in particular, to unities and tenths of nanometers, since the wavelength of charged particles in a beam is much less than the wavelength of an optic (in particular, laser) radiation. Such a focusing is attainable in, e.g., electron microscopes TECHNAT or FIB (both being available from PHILIPS Co.).

Irradiation of individual areas of said layer of material with a flux of charged particles transforms the material on said areas into a conducting component which forms therein a plurality of conducting structure elements, and a nonconducting component displaced into the material of the substrate. This effect is attained due to the fact that a definite ratio is selected in the proposed method between the energy values of charged particles and the structure, composition, and energy characteristics of the atoms of the material from which the layer applied to the substrate is made.

According to the proposed method, used as the material of the first layer is semiconductor or dielectric metalliferous material comprising at least atoms of a first kind and atoms of a second kind which differ in atomic number and are characterized by their threshold displacement energy. Each of the charged particles constituting the beam has an energy transferred by said particle upon its interaction with the atoms of the specific kind of the material of the layer in the course of irradiation, which energy is lower than the threshold displacement energy of the first-kind atoms and is higher than the threshold displacement energy of the second-kind atoms. As a result of irradiation of the layer of material, metallic atoms which are the first-kind atoms in this particular case, remain in the layer of material on the irradiated areas and form the conducting structure elements, while other atoms (i.e., the second-kind ones) are displaced into the substrate material virtually not affecting the properties thereof.

The energy transferred by a charged particle upon its interaction with said atoms of said material of said layer is found from the following relationship $$E_{max} = 4E_o \frac{M_1 \cdot M_2}{(M_1 + M_2)^2},$$

where
$E_{max}$ is maximum energy transferred by said charged particle to the atoms of each kind;
$E_o$ is the energy of said charged particle;
$M_1$ is the mass of said charged particle;
$M_2$ is the mass of said atom of each kind with which said charged particles collide.

The method proposed herein is carried into effect in a production plant whose process flowsheet is known to those skilled in the art. The plant comprises a source of charged particles (electrons or ions), as well as a mask, an electron or ion system of focusing lenses, and a substrate with the material applied thereto, all these components being accommodated in a reaction chamber. A required vacuum is established in the course of carrying out the method, or the chamber is filled with an inert gas.

The fact that the thickness of the layer of the material applied to the substrate is selected to range between 2 and 20 nm is dictated by a necessity to localize the zone of interaction between the charged beam and the material being transformed.

Now let us consider the processes proceeding in the layer of said material on an area thereof in the course of irradiation with charged particles. It is found experimentally that as the radiation emitted by the charged particles, in particular, electrons penetrates deeply inside the material, said particles are scattered on the atoms of the material which is accompanied by the onset of scattering, backscattering of electrons inclusive.

Taking account of the aforestated relationship between the energy of the charged particles, structure, composition, and energy characteristic of the atoms of the material of the layer applied to the substrate, a reaction runs inside the material, similar to that proceeding on the surface of the material, resulting in formation of a conducting component and a nonconducting component which is displaced into the material of the substrate. The radiation scattering process runs within the volume of a hemisphere and proceed further incrementally for a depth depending on the radiation power. The result is formation of a conducting structure element 1 (FIG. 1) on a substrate 2, shaped as a narrow-necked jug. It is evident that to obtain the smallest possible dimensions of the conducting structure elements (with measurement taken in the widest portion thereof), it is quite sufficient to use the upper portion of the resultant structure which is 2 to 20 nm thick. Depositing a layer 3 of said material having the abovestated thickness present no problems for modern technologies and can be effected by, e.g., the plasma evaporation technique.

When the layer thickness is in excess of 20 nm, the dimensions of individual conducting structure elements exceed the predetermined ones; when the layer thickness is below 2 nm, discontinuity of the material layer might occur, which affects adversely the quality of the conducting structure being formed.

Used as the material of the first layer is the material selected from the group consisting of metal hydrides, metal oxides, and metal nitrides. In particular, it is practicable that used as a metal hydride is lanthanum hydride or ytterbium hydride; used as a metal oxide is uranium dioxide, and used as a metal nitride is gallium nitride; however, some other metal hydrides, oxides and nitrides may be used.

The conducting structure can be formed to appear as metallic pattern on a dielectric substrate; or as a semiconductor pattern on a dielectric or metal substrate; or as a metallic pattern on another metal or on a semiconductor.

Thus, the proposed method provides for wide capabilities for use of conducting properties of various materials and allows of establishing conducting structures having required dimensions of individual elements on the order of unities of nanometers.

As has been stated hereinbefore, used as the source of charged particles may be a source of electrons (electron gun) or an ion source in the capacity of which may be any one of the heretofore-known sources, that is, thermionic, gas-discharge, surface-plasma, photodesorption, or other sources. Such constructions are widely known to those skilled in the art. Type of a charged particle source and its operating conditions are determined either by estimation or experimentally proceeding from the properties of the material being transformed.

For instance, when a layer of various oxides is used as the material of said layer, it is preferable to an ion source, such as hydrogen ions for reduction reactions to proceed.

When using metal nitrides or hydrides it is expedient to use an electron source.

In specific embodiments of the proposed method use can be made of a material which is in fact a supersaturated solid solution of a metal in a dielectric instead of metal hydrides or nitrides. In this case used as the dielectric can also be metal oxides or silicon oxide.

When electron beams are used, use is made of a substrate provided with holes in those areas thereof where the conducting structure elements are to be formed.

For forming the conducting structure pattern, a charged beam can be modulated using various techniques.

For instance, there may be used modulation of intensity of a whole charged beam accompanied by scanning a focused spot on the surface of the material layer being processed, or spatial modulation consisting in that a mask with a pattern made thereon is irradiated with an appropriately formed charged beam, whereupon the modulated radiation is focused onto the material layer on the substrate. Both techniques are commonly known to those skilled in the art and are described in papers on electron-beam lithography, scanning electron microscopy, as well as on photolithography.

Figure 2:
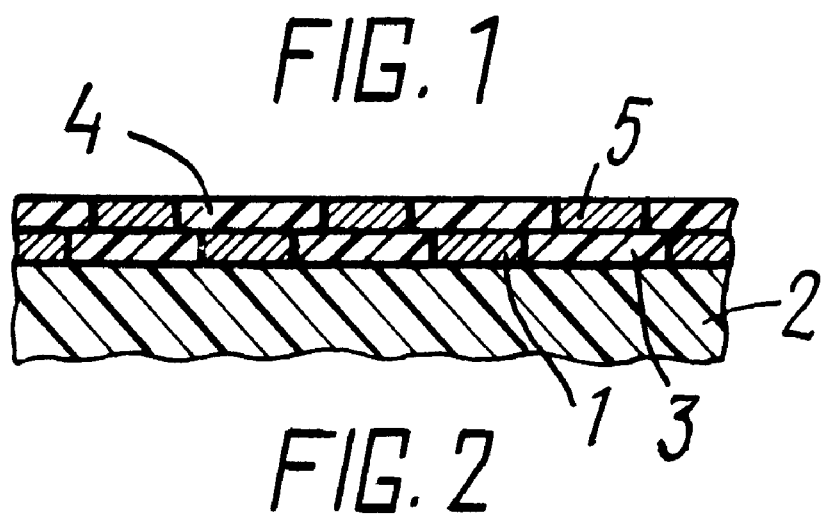
FIG. 2 is a sectional view of a three-dimensional conducting structure.

The proposed method allows also of forming three-dimensional conducting structures. Once the elements 1 of the first conducting structure has been formed in the first layer 3 of the material, a second layer 4 (FIG. 2) of the material is applied thereto, said material being transformable under the effect of charged particles. In this case the first layer 3 serves substantially as the substrate for the second layer 4 whose thickness is also selected to be within 2 and 20 nm. Further on the method is carried out as described before with reference to the first layer 3 of the material taking due account of all aforementioned relationship between the energy of the charged particles, structure, and properties of the material of the second layer. As a result of irradiation, individual elements 5 of the conducting structure are also formed on the second layer 4 of the material. In this case used for forming a required pattern is the mask of the same or other configuration as shown in FIG. 2 which illustrates a layer structure formed with the use of another mask for forming a conducting structure on the second layer of the material. Similar masks may be used of for quantity production of electronic circuits.

Thus, a three-dimensional layer-type conducting structure is formed by successively establishing conducting structures on each layer, each layer of said layer-type structure having a thickness of the same order as the linear dimensions of the individual elements 1 and 5 of the conducting structure.

Figure 3:
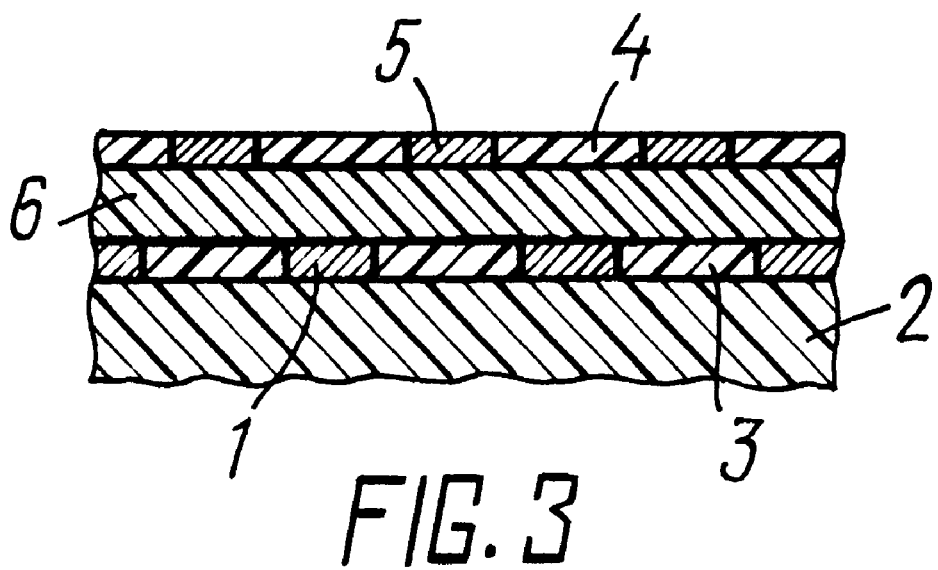
FIG. 3 is a view of FIG. 2 showing a dielectric layer interposed between the conducting structures.

According to the proposed method, three-dimensional layer-type conducting structures can be formed, having their individual layers separated from one another by a dielectric layer 6 as shown in FIG. 3. Once the first conducting structure has been formed, the dielectric layer 6 having a required thickness is applied thereto, upon which there is applied the layer 4 of a material transformable into a conducting layer under the effect of radiation. Further on the method is carried out in a sequence mentioned before. The resultant three-dimensional layer-type conducting structures can be used for formation of multilayer ultra large-scale integrated circuits (ULSIC).

EXAMPLE 1

A lanthanum hydride layer 2, 4, 8, 10 or 20 nm thick is applied to a silicon-oxide substrate appearing as a wafer measuring 5×5×0.4 mm, using any heretofore-known technique. Then said substrate is placed in the reaction chamber of the abovedescribed production plant and fixed in place therein. A tungsten mask measuring 20×20×0.1 mm provided with a pattern appearing as rows of round holes 100 nm in diameter and of lines, each being 100 nm wide and 30 mm long the pattern elements being spaced 1000 nm apart from one another. Then a vacuum of $10^{-9}$ torr is established in the radiation chamber, first using a turbomolecular pump, then an ion-type pump. Used as a source of charged particles is an electron gun having a tungsten thermionic cathode. An average electron energy is 200 keV, an electron beam current being 1 mcA. The proposed method is carried out on lanthanum hydride layers 2, 4, 8, 10, or 20 nm thick. The results are tabulated in Table 1 below.

EXAMPLE 2

The method is carried out with the same parameters as in Example 1 with the sole exception that used as a transformable material is gallium nitride. The results are tabulated also in Table 1.

EXAMPLE 3

The method is carried out with the same parameters as in Example 1 with the exception that used as a source of charged particles is a proton source which provides for generation of hydrogen ions having an energy of 1 keV. An ytterbium layer is applied to the substrate. The results are present in Table 2 below.

EXAMPLE 4

The method is carried out as in Example 2 with the sole exception that used as a transformable material is uranium dioxide. The results are given in Table 2.

EXAMPLE 5

The method is carried out as in Examples 1 and 2 with the sole exception that used as a transformable material is lanthanum oxide in a layer 10 nm thick. The result is a conducting structure having individual elements 10 nm thick each, to which a silicon-oxide layer 100 nm thick and another lanthanum oxide layer 10 nm thick are applied. The formed layer is irradiated as in Examples 1 and 2, using a mask whose pattern differs from that of the mask used for forming the first conducting structure. As a result, a conducting structure having the elements measuring 10 nm is provided on the second layer.

Thus, the proposed invention allows of producing both planar and three-dimensional conducting structures with their individual elements having the dimensions on the order of unities of nanometers which adds much to the resolution capability of the method.

EXAMPLE 6

The method is carried out as in Examples 1 with the sole exception that used as the material is lanthanum oxide and the layer is 10 nm thick. Upon irradiating said layer with an electron beam having an energy of 200 keV lanthanum atoms remain in the layer, whereas oxygen atoms are displaced into the substrate material. The threshold displacement energy of lanthanum atoms is over 20 ev, while threshold displacement energy of oxygen atoms is below 5 eV. As a result, a lanthanum conducting structure is obtained having its individual elements measuring 5 nm.

EXAMPLE 7

The method is carried out as in Example 3 with the sole exception that used as the material of the 10 nm thick layer is tungsten oxide. The proton mass is unity, the proton energy is 900 eV, the threshold displacement energy of tungsten exceeds 200 eV, that of oxygen is 100 eV. The result is a tungsten conducting structure having its individual elements measuring 8 nm.

EXAMPLE 8

The method is carried out as in Example 7, irradiation is carried out with protons having an energy of 900 eV. Used as the material of the layer is PbHfO$_3$, the layer thickness is 10 nm. Maximum energy transferred by protons is 199 eV for oxygen atoms, 20.2 eV for hafnium atoms, and 17.4 eV for lead atoms. The threshold displacement energy for said atoms is 60 eV, 31 eV, and 25 eV, respectively. Thus, irradiating said material with protons results in formation of conducting elements from hafnium and lead atoms and in penetration of oxygen atoms into the substrate material. The resultant conducting structure has its individual elements measuring 7 nm.

TABLE 1

| Material | Average ion energy, kev | Layer thickness, nm | Dimensions of pattern element, nm |
| --- | --- | --- | --- |
| Lanthanum hydride | 200 | 2 | 5 |
| | | 4 | 7 |
| | | 8 | 12 |
| | | 10 | 15 |
| | | 20 | 28 |
| Gallium nitride | 200 | 2 | 6 |
| | | 4 | 8 |
| | | 8 | 14 |
| | | 10 | 17 |
| | | 20 | 30 |

TABLE 2

| Material | Average electron energy, keV | Layer thickness nm | Dimensions of conducting structure element, nm |
| --- | --- | --- | --- |
| Ytterbium hydride | 1 | 2 | 3 |
| | | 4 | 5 |
| | | 8 | 10 |
| | | 10 | 12 |
| | | 20 | 25 |
| Uranium dioxide | 1 | 2 | 3.5 |
| | | 4 | 5.5 |
| | | 8 | 11 |
| | | 10 | 13.5 |
| | | 20 | 27 |

What we claim is:

1. A method of forming a conducting structure, comprising:
    applying to a substrate a first layer of a material transformable into a conducting one when exposed to the effect of radiation;
    carrying out said application of said first layer 2 to 20 nm thick;
    establishing a beam of charged particles;
    irradiating said first layer of said material with said modulated beam of charged particles;
    transforming said material of said first layer on irradiated areas thereof into a conducting component which establishes in said first layer a plurality of conducting structure elements, a nonconducting component displaced into the material of said substrate.

2. The method of claim 1, comprising:
    using as said material of said first layer a single-phase semiconductor or dielectric metalliferous material comprising at least atoms of a first kind and atoms of a second kind which differ in atomic number;
    establishing said charged particle beam using a plurality of charged particles, each of which having an energy transferred by said particle upon its interaction with said atoms of said material of said first layer in the course of said irradiation, which energy is lower than a threshold displacement energy of said first-kind atoms and is higher than a threshold displacement energy of said second-kind atoms;
    displacing said second-kind atoms on irradiated areas of said first layer into the material of said substrate;
    transforming said first-kind atoms on the irradiated areas of said layer into a plurality of conducting structure elements.

3. The method of claim 2, wherein the energy transferred by a charged particle upon its interaction with said atoms of said material of said first layer is found from the following relationship $$E_{\max} = 4E_o \frac{M_1 \cdot M_2}{(M_1 + M_2)^2},$$

where
    $E_{max}$ is maximum energy transferred by said charged particle to the atoms of each kind;
    $E_o$ is the energy of said charged particle;
    $M_1$ is the mass of said charged particle;
    $M_2$ is the mass of said atom of each kind with which said charged particles collide.

4. The method of claim 3, wherein said material of said first layer is selected from the group consisting of metal hydrides, metal oxides, and metal nitrides.

5. The method of claim 4, wherein said metal hydride is lanthanum hydride or ytterbium hydride.

6. The method of claim 4, wherein said metal oxide is uranium dioxide.

7. The method of claim 4, wherein said metal nitride is gallium nitride.

8. The method of claim 4, wherein said material of said substrate is selected from the group consisting of a dielectric material, a semiconductor material, and an electrically conducting material.

9. The method of claim 1, wherein said irradiation of said first layer of said material is effected with a modulated electron beam.

10. The method of claim 1, wherein said irradiation of said first layer of said material is effected with a modulated ion beam.

11. The method of claim 1, comprising:
using said first layer of said material after a plurality of conducting structure elements have been therein established, as a substrate for forming a three-dimensional conducting structure;
successively applying a plurality of ensuing layers of said material transformable into a conducting layer under the effect of radiation to each preceding layer after a plurality of conducting structure elements have been thereon established;
successively applying each of said ensuing layers of said plurality of layers to each of said preceding layer with a thickness of 2 to 20 nm;
successively irradiating each of said ensuing layers of said plurality of layers with a modulated beam of charged particles;
transforming said material of each of said ensuing layers of said plurality of layers on its irradiated areas into a conducting component which establishes in each of said ensuing layers a plurality of conducting structure elements, and nonconducting components which are displaced into said material of said preceding layer.

12. The method of claim 11, comprising:
said material of said first layer is a single-phase semiconductor or dielectric metalliferous material comprising at least atoms of a first kind and atoms of a second kind which differ in atomic number;
establishing said charged particle beam using a plurality of charged particles, each of which having an energy transferred by said particle upon its interaction with said atoms of said material of said first layer in the course of said irradiation, which energy is lower than a threshold displacement energy of said first-kind atoms and is higher than a threshold displacement energy of said second-kind atoms;
displacing said second-kind atoms on irradiated areas of said ensuing layer into the material of said preceding layer;
transforming said first-kind atoms on the irradiated areas of said layer into a plurality of conducting structure elements.

13. The method of claim 12, wherein the energy transferred by a charged particle upon its interaction with said atoms of said material of said first or ensuing layer is found from the following relationship $$E_{max} = 4E_o \frac{M_1 \cdot M_2}{(M_1 + M_2)^2},$$

where
$E_{max}$ is maximum energy transferred by said charged particle to the atoms of each kind;
$E_o$ is the energy of said charged particle;
$M_1$ is the mass of said charged particle;
$M_2$ is the mass of said atom of each kind with which said charged particles collide.

14. The method of claim 12, wherein said material of said preceding layer is selected from the group consisting of a dielectric material, a semiconductor material, and an electrically conducting material.

15. The method of claim 11, wherein said material of each of said next layers is selected from the group consisting of metal hydrides, metal oxides, and metal nitrides.

16. The method of claim 15, wherein said metal hydride is lanthanum hydride or ytterbium hydride.

17. The method of claim 15, wherein said metal oxide is uranium dioxide.

18. The method of claim 15, wherein said metal nitride is gallium nitride.

19. The method of claim 11, wherein said irradiation of each of said ensuing layers is effected with a modulated electron beam.

20. The method of claim 11, wherein said irradiation of each of said ensuing layers is effected with a modulated ion beam.

21. The method of claim 11, wherein an intermediate layer of a dielectric material is interposed between each of said preceding layers and each of said ensuing layers of said plurality of layers.

* * * * *